United States Patent
Lin et al.

(10) Patent No.: US 7,141,962 B2
(45) Date of Patent: Nov. 28, 2006

(54) ELECTRICAL MAGNETIC INTERFERENCE TEST SYSTEM

(75) Inventors: Chin-Yuan Lin, Taichung (TW); Ming-Fang Wu, Taichung (TW); Pei-Chih Liu, Dongshih Township, Taichung County (TW); Yu-Kuo Wang, Hsinchu (TW); Yi-Kai Lin, Hsinchu (TW); Sheng-Lee Lin, Beipu Township, Hsinchu County (TW)

(73) Assignee: Avision Inc., Hsinchu (TW)

( * ) Notice: Subject to any disclaimer, the term of this patent is extended or adjusted under 35 U.S.C. 154(b) by 0 days.

(21) Appl. No.: 11/179,564

(22) Filed: Jul. 13, 2005

(65) Prior Publication Data

US 2006/0017428 A1    Jan. 26, 2006

(30) Foreign Application Priority Data

Jul. 20, 2004    (TW) .............................. 93121667 A (51) Int. Cl.
*G01R 23/00*    (2006.01)
(52) U.S. Cl. .................................................. 324/76.19
(58) Field of Classification Search ................ 324/627, 324/703
See application file for complete search history.

(56) References Cited

U.S. PATENT DOCUMENTS

| | | | | |
|---|---|---|---|---|
| 4,929,960 A | * | 5/1990 | Kaylor et al. | ............... 343/703 |
| 5,430,456 A | * | 7/1995 | Osburn et al. | ............. 343/703 |
| 5,532,704 A | * | 7/1996 | Ruelle | ........................ 343/703 |
| 6,734,353 B1 | * | 5/2004 | Holmlund et al. | ........ 174/35 R |

* cited by examiner

*Primary Examiner*—Vincent Q. Nguyen
(74) *Attorney, Agent, or Firm*—Rabin & Berdo, P.C.

(57) ABSTRACT

An EMI (Electrical Magnetic Interference) test system is provided. The system includes a testing table, a horizontal antenna, a vertical antenna and a processing unit. The testing table is used for supporting an Equipment Under Test (EUT). The horizontal antenna is positioned at a first location in an EMI chamber. The vertical antenna is positioned at a second location in the EMI chamber. The vertical antenna and the horizontal antenna are used for receiving the electromagnetic wave radiated from the EUT, and producing a vertical electric wave and a horizontal electric wave respectively. The processing unit is coupled to the vertical antenna and the horizontal antenna for transforming and analyzing the vertical electric wave and the horizontal electric wave.

21 Claims, 8 Drawing Sheets

ELECTRICAL MAGNETIC INTERFERENCE TEST SYSTEM

This application claims the benefit of Taiwan application Ser. No. 93121667, filed Jul. 20, 2004, the subject matter of which is incorporated herein by reference.

BACKGROUND OF THE INVENTION

1. Field of the Invention

The invention relates to an electrical magnetic interference (EMI) test system, and more particularly to an EMI test system which is disposed in the EMI chamber.

2. Description of the Related Art

The electronic products have become essential and omnipresent in the modern society. Most of the electronic products produce electromagnetic waves, and the electromagnetic waves stronger than regulated standard are harmful to human body. Therefore, before the electronic products are available in the market or exported, they should be tested by the EMI test system. Only those qualified products can obtain the permission to be marketed and exported.

Figure 1A:
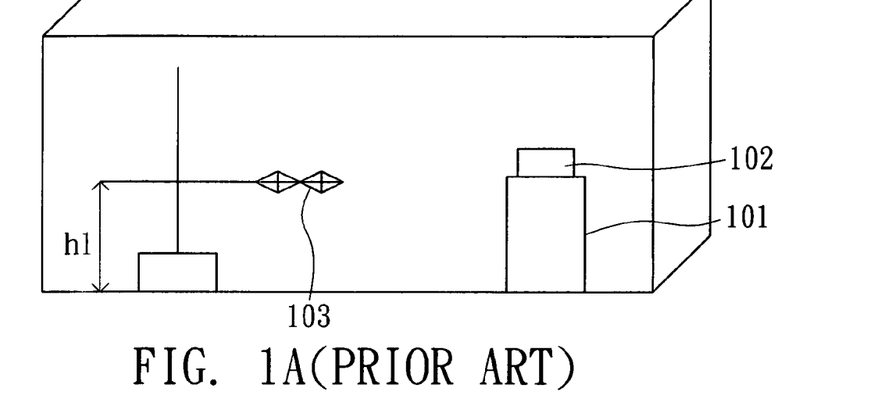
FIG. 1A (Prior Art) is a first schematic diagram illustrating a conventional electrical magnetic interference (EMI) test system.
Figure 1B:
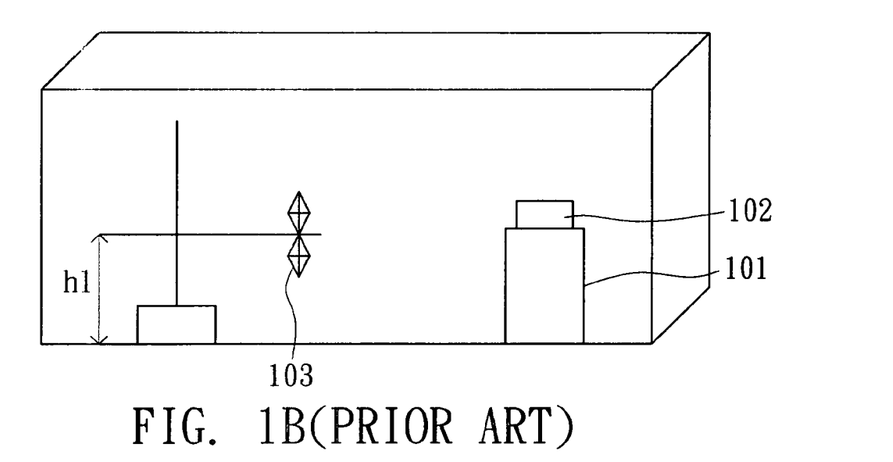
FIG. 1B (Prior Art) is a second schematic diagram illustrating the conventional EMI test system.
Figure 1C:
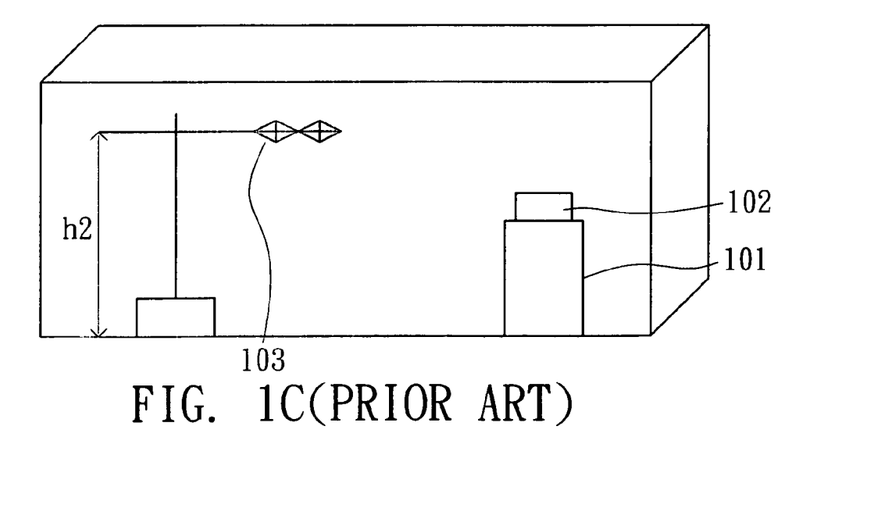
FIG. 1C (Prior Art) is a third schematic diagram illustrating the conventional EMI test system.
Figure 1D:
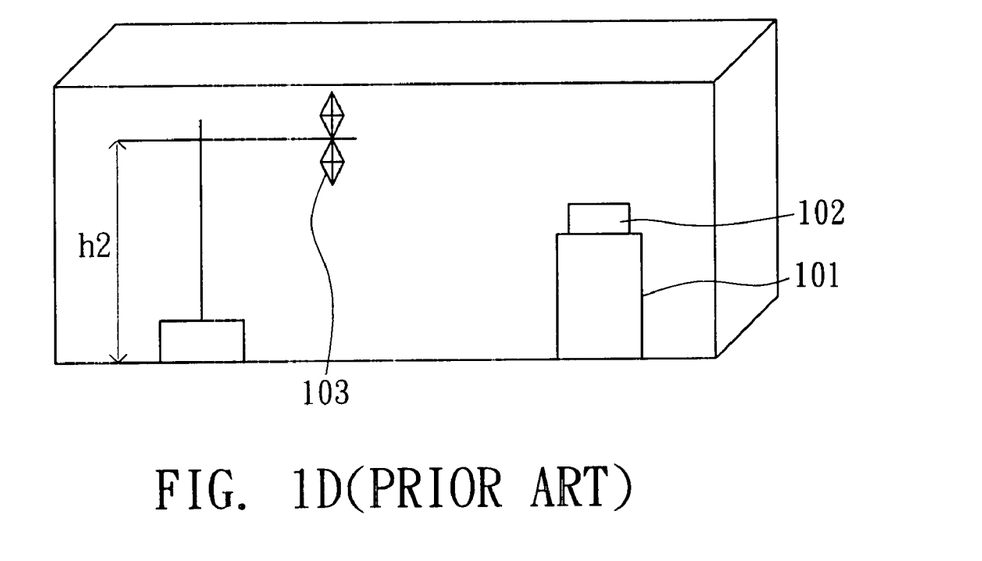
FIG. 1D (Prior Art) is a fourth schematic diagram illustrating the conventional EMI test system.

Currently, the method of testing electromagnetic wave is to place the electronic products into the EMI chamber for testing. FIGS. 1A, 1B, 1C and 1D respectively illustrate the first schematic diagram, the second schematic diagram, the third schematic diagram and the fourth schematic diagram of the conventional electric wave test system. As shown in FIG. 1A, when the equipment under test (EUT) 102 is placed on the testing table 101 for testing, the antenna 103 is adjusted to be horizontal and at a height of h1 for receiving the electromagnetic waves. Then the antenna 103 is positioned vertically to receive the electromagnetic waves from the EUT 102 and is still at the height of h1, as shown in FIG. 1B. As illustrated in FIG. 1C, the antenna 103 then is adjusted to be horizontal and at the height of h2 for testing the electromagnetic of the EUT 102. At last, in FIG. 1D, the antenna 103 is at the height of h2 and adjusted again to be vertical for re-testing so as to complete the test. Therefore, the conventional method for testing electromagnetic waves requires four phases of adjustments, including adjusting the antenna to be horizontal, adjusting the antenna to be vertical, adjusting the height of antenna, and arranging the direction of the antenna after its height is fixed. Thus, the conventional procedure for testing electromagnetic waves through the conventional EMI test system is not only complicated but also time-consuming and requires strenuous efforts.

SUMMARY OF THE INVENTION

It is therefore an object of the invention to provide an EMI test system to reduce the time required for testing the electromagnetic waves of the EUT, so as to complete the test quickly. This object is achieved by the design in which both the horizontal antenna and the vertical antenna are disposed in the EMI chamber in order to save time from adjusting the horizontal antenna into vertical antenna. Also, the time spent on shifting the horizontal antenna or vertical antenna to a different height is saved by disposing antennas at different heights.

It is an object of the present invention to provide an EMI test system, which includes a testing table, a horizontal antenna, a vertical antenna, and a processing unit. The testing table is used for supporting a EUT. The horizontal antenna and the vertical antenna are positioned at two different locations in an EMI chamber for receiving the electromagnetic wave radiated from the EUT, and producing a horizontal electric wave and a vertical electric wave respectively. The processing unit is used for receiving and analyzing the horizontal electric wave and the vertical electric wave.

It is an object of the present invention to further provide an EMI test system, which includes: a testing table, an antenna assembly, and a processing unit. The testing table is used for supporting a EUT. The antenna assembly is positioned at one location in the EMI test system. The antenna assembly includes a horizontal antenna and a vertical antenna placed at the same height to produce a horizontal electric wave and a vertical electric wave respectively. The processing unit is used for receiving and analyzing the horizontal electric wave and the vertical electric wave.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment I

Figure 2A:
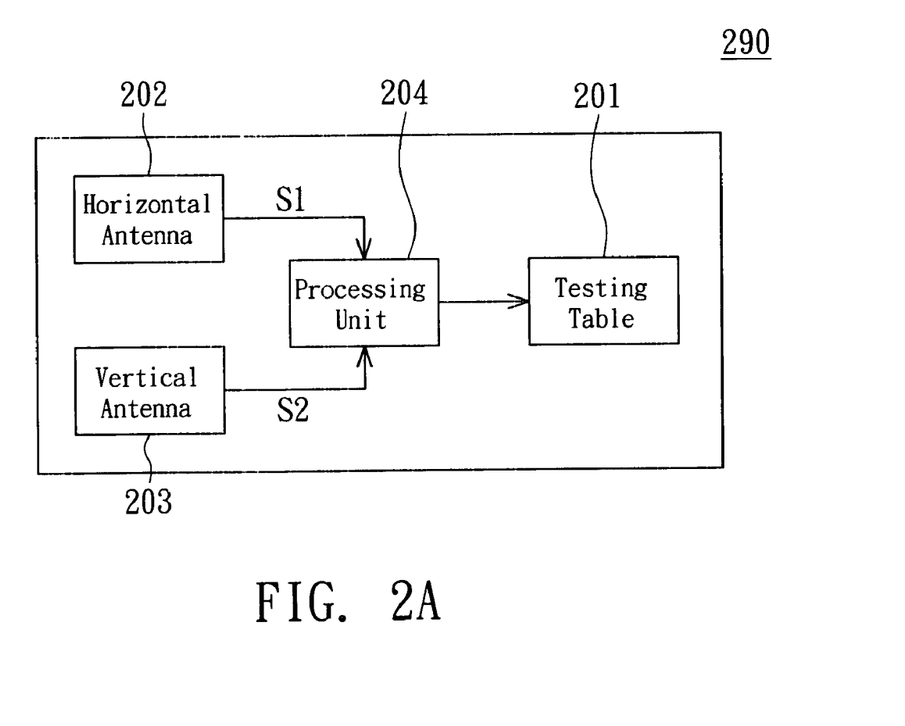
FIG. 2A is a schematic diagram of an EMI test system according to a first embodiment.
Figure 2B:
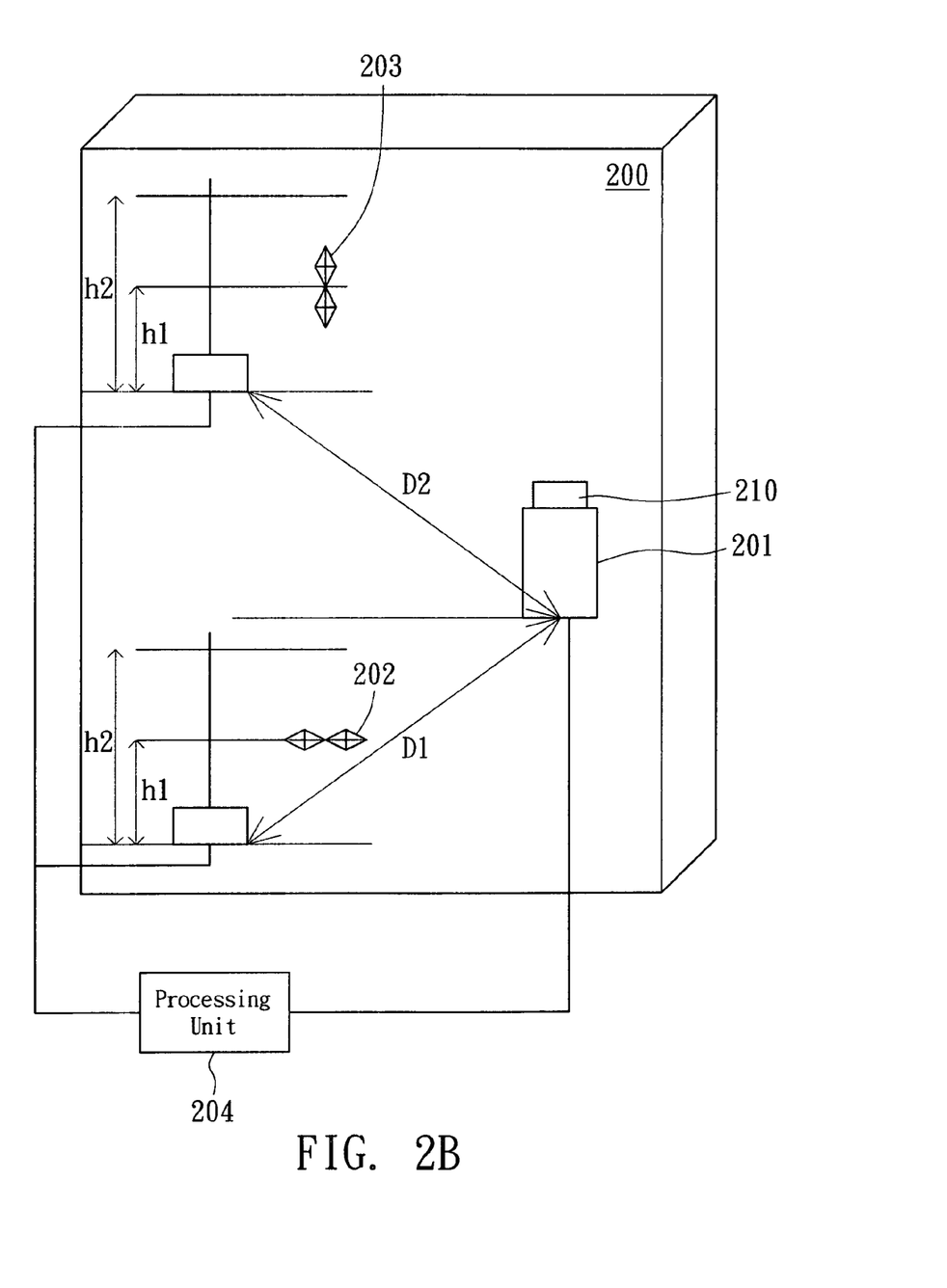
FIG. 2B is a schematic diagram illustrating the antenna configuration of the EMI test system according to the first embodiment.

Referring to FIG. 2A, a schematic diagram of an EMI test system according to the first embodiment is shown. The EMI test system 290 includes a testing table 201, a horizontal antenna 202, a vertical antenna 203 and a processing unit 204. FIG. 2B is a schematic diagram illustrating the positions of antennas in the EMI test system according to the first embodiment. The testing table 201 is used for supporting an equipment under test (EUT) 210. The horizontal antenna 202 is positioned in one location in the EMI chamber 200. The distance between the horizontal antenna 202 and the EUT 210 is D1. The vertical antenna 203 is positioned at another location in the EMI chamber 200. The distance between the vertical antenna 202 and the EUT 210 is D2. D2 is substantially equal to D1, for example, 3 meters in length. The horizontal antenna 202 and the vertical antenna 203 are coupled to the processing unit 204. When the EUT 210 is in the operating state, the EUT emits the electromagnetic wave. The horizontal antenna 202 and the vertical antenna 203 receive the electromagnetic waves radiated from EUT 210 and accordingly produce a horizontal electric wave s1 and a vertical electric wave s2 respectively, as shown in FIG. 2A. The horizontal electric wave s1 and the vertical electric wave s2 are the examples of the horizontal electric wave and the vertical electric wave. The processing unit 204 is coupled to the horizontal antenna 202 and the vertical antenna 203. The processing unit 204 is used for transforming and analyzing the horizontal electric wave s1 and the vertical electric wave s2.

Figure 2C:
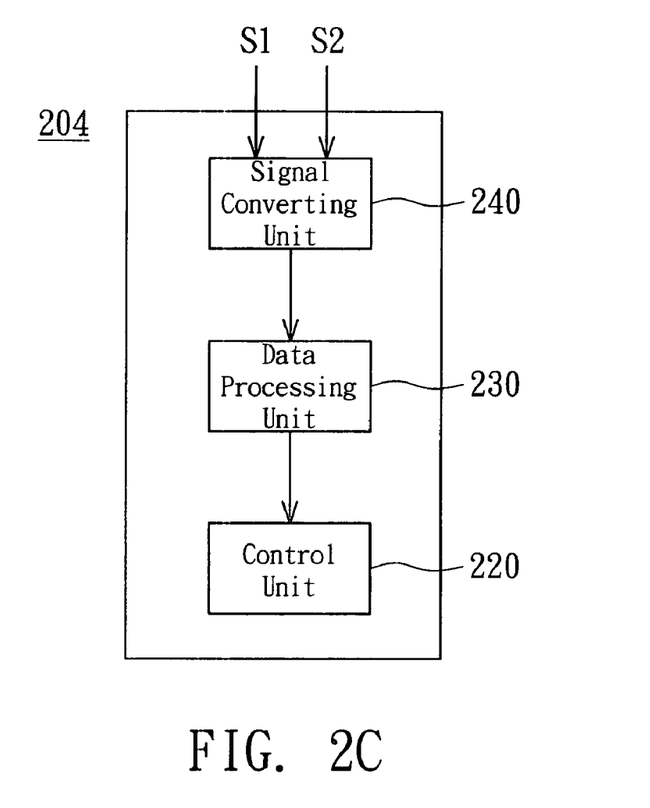
FIG. 2C is a block diagram illustrating the processing unit.
Figure 2D:
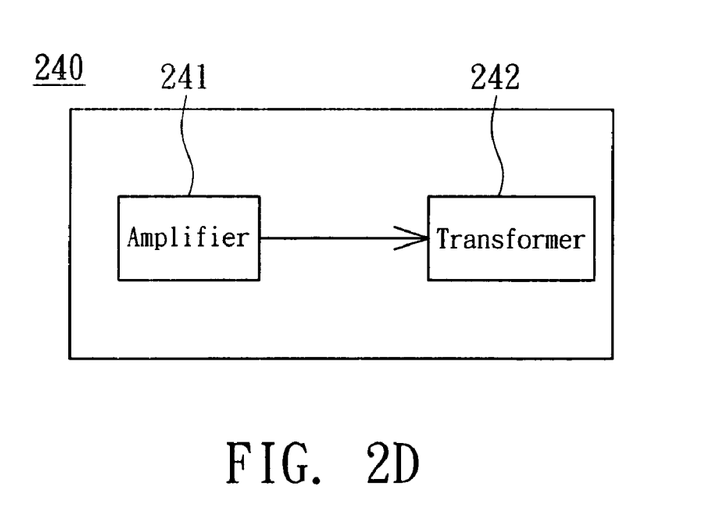
FIG. 2D is a block diagram of the data processing unit.

Referring to FIG. 2C, a block diagram of the processing unit is shown. The processing unit 204 includes a control unit 220, a signal converting unit 240, and a data processing unit 230. FIG. 2D is a block diagram of the data processing unit. The signal converting unit 240 is provided with an amplifier 241 and a transformer 242. The spectrum analyzer is an example of the transformer 242. The amplifier 241 connects to the horizontal antenna 202 and the vertical antenna 203 respectively. The transformer 242 connected to the amplifier 241 is used for transforming the horizontal electric wave s1 and the vertical electric s2 into the horizontal signal H1 and the vertical signal V1, respectively. The computer is an example of the data processing unit 230, which connects to the control unit 220 and is used for analyzing the horizontal signal H1 and the vertical signal V1. The control unit 220 is used for adjusting the height of the horizontal antenna 202 and the vertical antenna 203 and for adjusting a rotation angle of the testing table 201. When the testing table 201 rotates a certain angle, the first horizontal antenna 202 and the vertical antenna 203 receive the electromagnetic waves from the testing table 201 positioned at the certain angle. After the electromagnetic wave is analyzed through the amplifier 241, the transformer 242 and the data processing unit 230 located in the processing unit 204, the testing table 201 regulated by the control unit 220 is positioned at another angle to perform electromagnetic wave testing. The testing table 201 can be controlled by the control unit 220 for the 360-degree rotation so that the electromagnetic waves radiated from EUT 210 can be detected from different angles.

Referring to FIG. 2B, the EMI chamber has three different sizes and can be a space of 7×3×3 cubic meters, a space of 7×4×3 cubic meters, or a space of 7×4×3 cubic meters. When the EMI test system is disposed in the EMI chamber 200 of 7×3×3 cubic meters or the EMI chamber 200 of 7×4×3 cubic meters, the height h1 of the horizontal antenna 202 and the vertical antenna 203 at their testing position is 1 meter, for example. After testing at this height, the horizontal antenna 202 and the vertical antenna 203 regulated by the control unit 220 are positioned at a height h2, such as 2 meters, to perform testing. However, when the size of the EMI chamber 200 is 9×6×6 cubic meters, the horizontal antenna 202 and the vertical antenna 203 are regulated by the control unit 220 from the height h1, such as 1 meter, to the height h2, such as 3 meters, to perform testing, as shown in FIG. 2C. As shown in FIG. 2B, the time spent on arranging the horizontal antenna 202 into vertical antenna 203 is saved by the design in which the horizontal antenna 202 and the vertical antenna 203 are disposed at different locations in the EMI chamber 200 with the same height.

Second Embodiment

Figure 3:
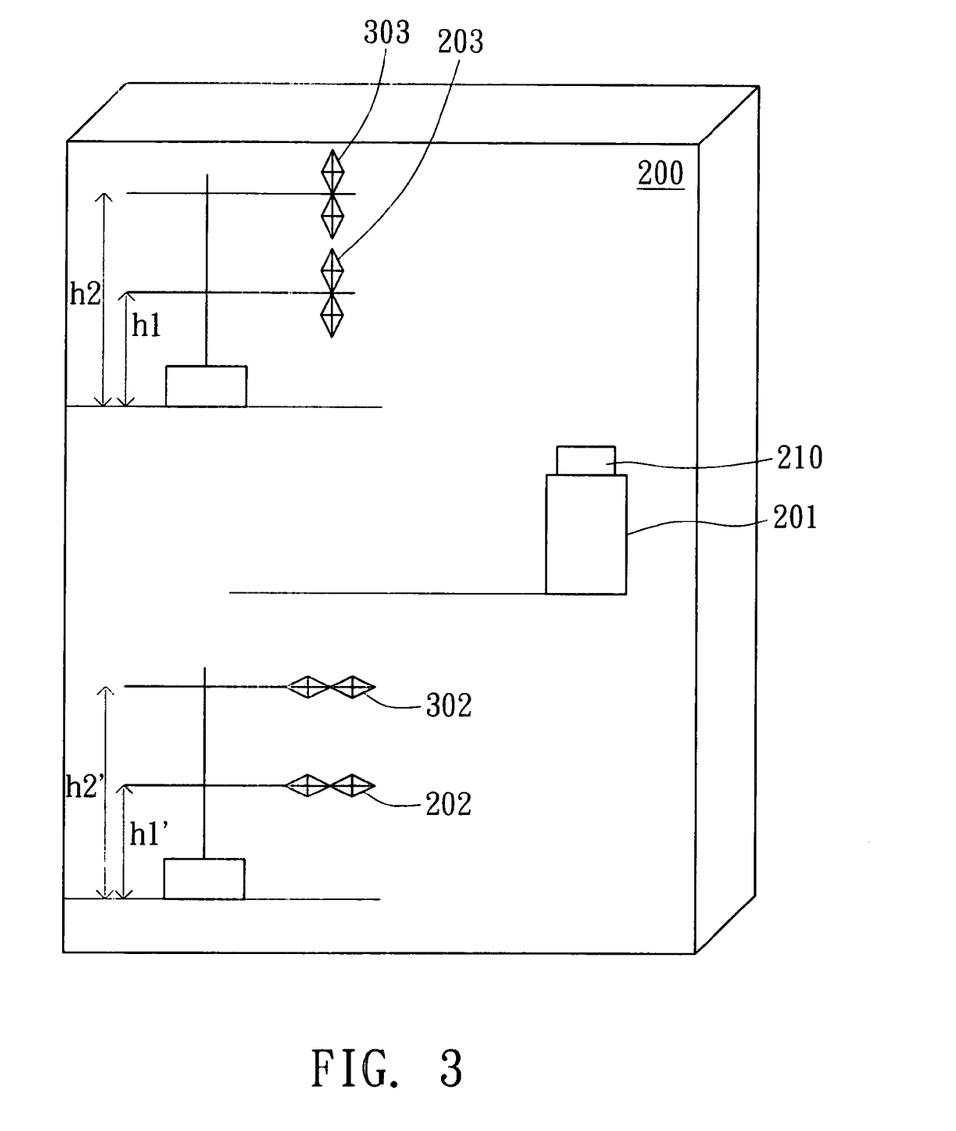
FIG. 3 is a schematic diagram illustrating an EMI test system according to a second embodiment.

Referring to FIG. 3, a schematic diagram of the EMI test system according to the second embodiment is shown. The EMI chamber includes a testing table 201, a first horizontal antenna 202, a second horizontal antenna 302, a first vertical antenna 203 and a second vertical antenna 303. If the EMI chamber 200 is a space of 7×3×3 or 7×4×3 cubic meters, the first horizontal antenna 202, and the first vertical antenna 203 regulated by the control unit 230 shown in FIG. 2C are positioned at a height h1, such as 1 meter, and the second horizontal antenna 302 and the vertical antenna 303 regulated by the control unit 230 are positioned at a height h2, such as 2 meters to perform testing. If the size of the EMI chamber 200 is 9×6×6 cubic metes, the first horizontal antenna 202 and the first vertical antenna 203 regulated by the control unit 220 are positioned at a height h1, such as 1 meter, and the second horizontal antenna 302 and the second vertical antenna 303 regulated by the control unit 220 are positioned at a height h2, such as 3 meters. The second horizontal antenna 302 is positioned parallel to the first horizontal antenna 202. The second vertical antenna 303 is positioned parallel to the first vertical antenna 203. As described in the first embodiment, the first horizontal antenna 202 and the second horizontal antenna 302 receive the electromagnetic waves radiated from the EUT and produce the horizontal electric wave s1. The first vertical antenna 203 and the second vertical antenna 303 receive the electromagnetic wave radiated from the EUT 210 and produce the vertical electric wave s2. The first horizontal antenna 202 is level with the first vertical antenna 203. The second horizontal antenna 302 is level with second vertical antenna 303.

Third Embodiment

Figure 4:
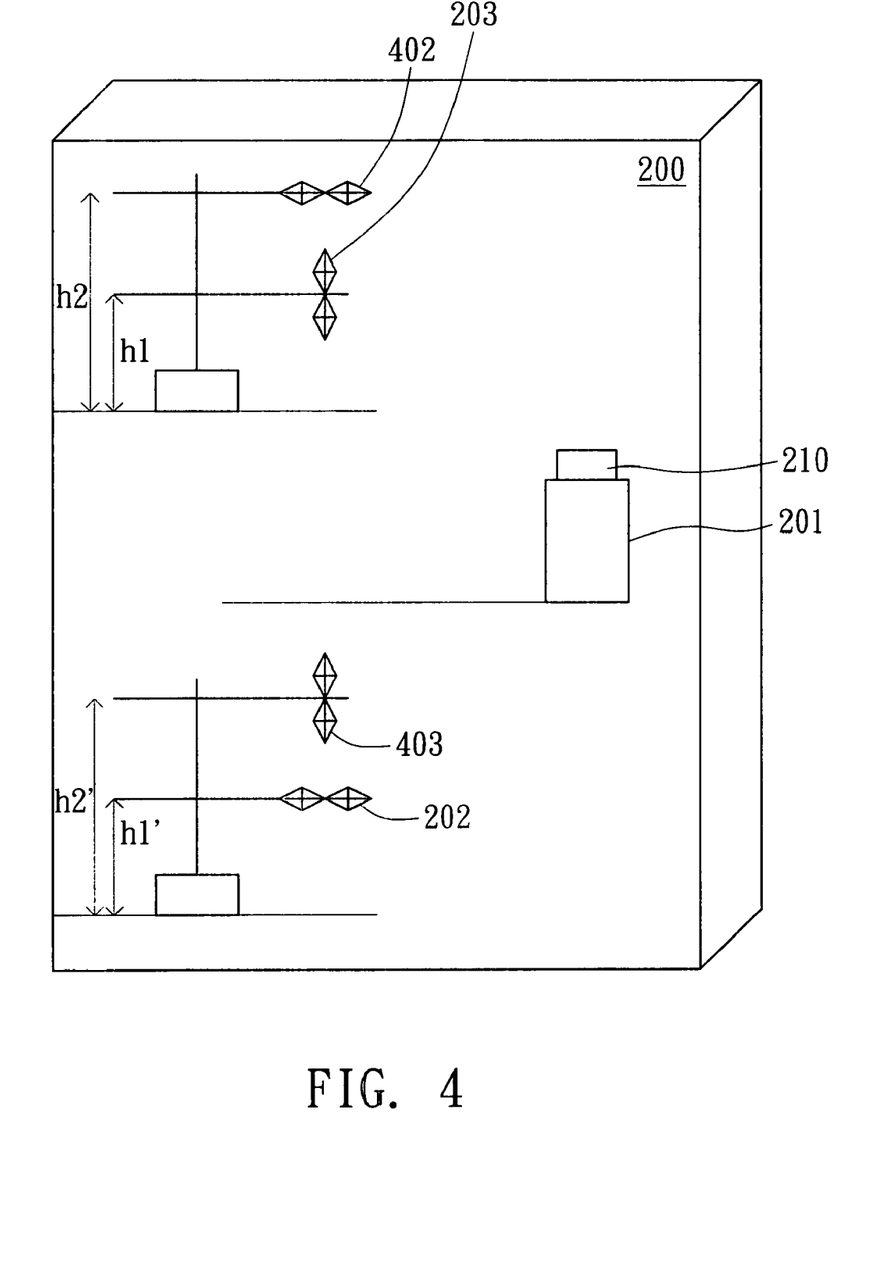
FIG. 4 is a schematic diagram illustrating an EMI test system according to a third embodiment.

Referring to FIG. 4, a schematic diagram illustrating the EMI test system according to the third embodiment is shown. The EMI chamber 200 includes a testing table 201, a first horizontal antenna 202, a second horizontal antenna 402, a first vertical antenna 203 and a second vertical antenna 403. If the EMI chamber 200 is a space of 7×3×3 or 7×4×3 cubic meters, the first horizontal antenna 202, and the first vertical antenna 203 regulated by the control unit 230 shown in FIG. 2C are positioned at a height h1, such as 1 meter, and the second horizontal antenna 402 and the second vertical antenna 403 regulated by the control unit 230 are positioned at a height h2, such as 2 meters. If the size of the EMI chamber 200 is 9×6×6 cubic metes, the first horizontal antenna 202 and the first vertical antenna 203 regulated by the control unit 230 are positioned at a height h1', such as 1 meter, and the second horizontal antenna 402 and the second vertical antenna 403 regulated by the control unit 230 are positioned at a height h2', such as 3 meters. The second horizontal antenna 402 is positioned parallel to the first horizontal antenna 203. The second vertical antenna 403 is positioned parallel to the first vertical antenna 202. As described in the first embodiment, the processing unit 204 is used for transforming and analyzing the horizontal electric wave s1 and the vertical electric wave s2 received by the first horizontal antenna 202 and the second horizontal antenna 402 and the first vertical antenna 203 and the second vertical antenna 403. As shown in FIG. 3 and FIG. 4, both horizontal antenna and the both vertical antenna in the EMI chamber are positioned at different heights. Accordingly, not only time spending on regulating the horizontal antenna into vertical antenna is saved, but also spending on regulating the horizontal antenna or vertical antenna to different heights for testing is also saved.

Fourth Embodiment

Figure 5A:
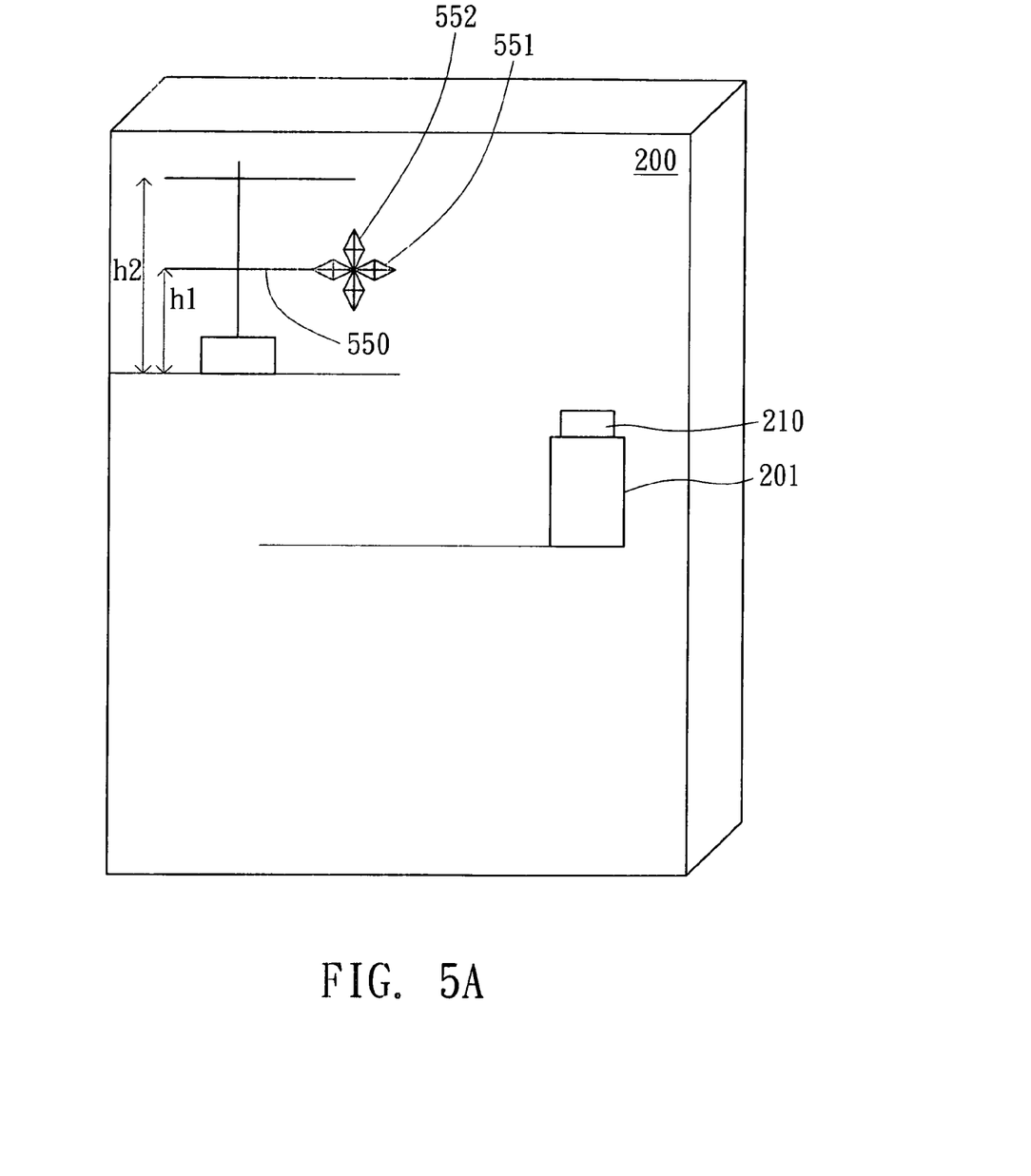
FIG. 5A is the schematic diagram illustrating an EMI test system according to a fourth embodiment.
Figure 5B:
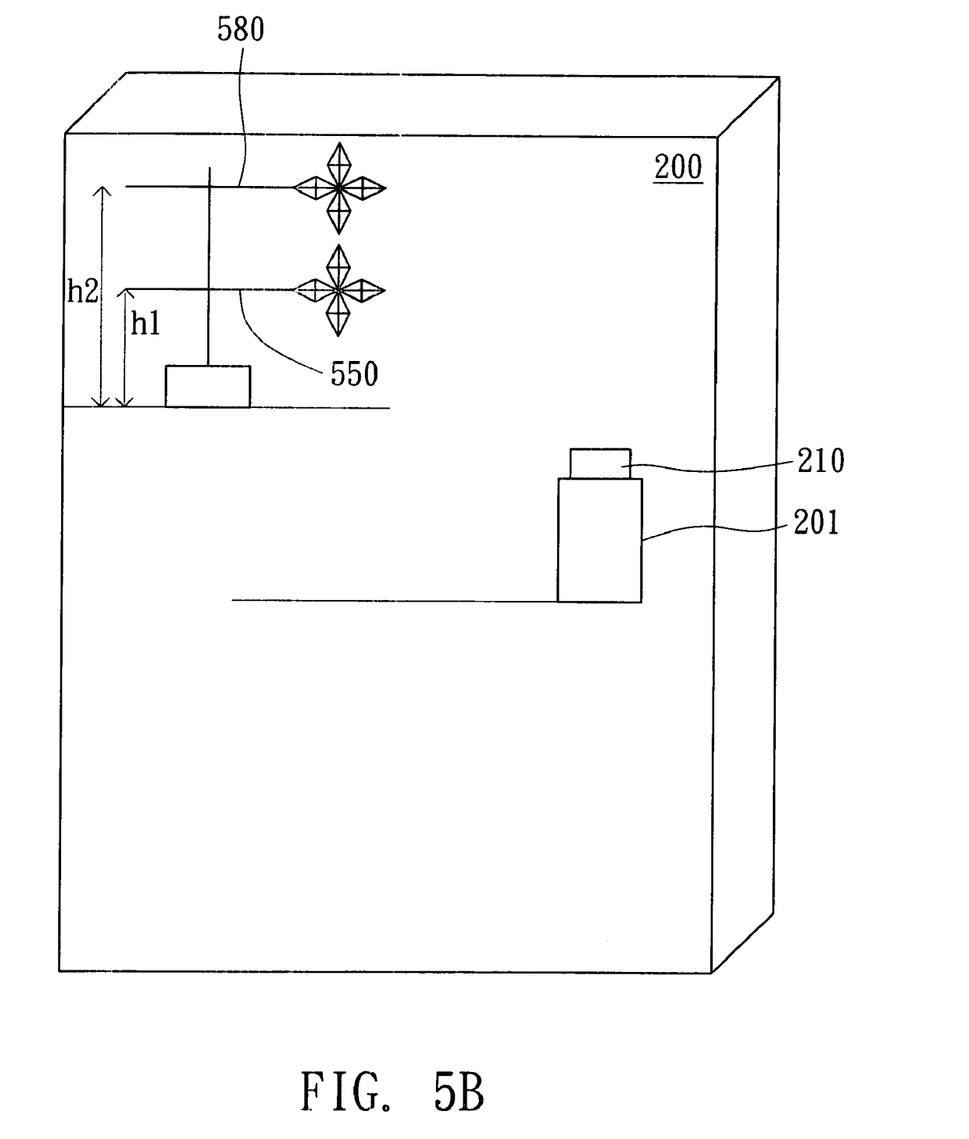
FIG. 5B is the schematic diagram illustrating an EMI testing system, which is equipped with the first antenna assembly and the second antenna assembly.

Referring to FIG. 5A, a schematic diagram of EMI test system according to the fourth embodiment of the present invention is shown. The EMI chamber includes a testing table 201 and a first antenna assembly 550. The testing table 201 is used for supporting a EUT 210. The first antenna assembly 550 is positioned at one location in the EMI test system. The first antenna assembly 550 including a horizontal antenna 551 and a vertical antenna 552 are used for receiving an electromagnetic wave and accordingly producing the horizontal electric wave s1 and the vertical electric wave s2 as described in the first embodiment. The horizontal antenna 551 and the vertical antenna 552 are both positioned at a height h1, such as 1 meter and used for simultaneously receiving the electromagnetic wave radiated from the EUT 210. Referring to FIG. 5B, a schematic diagram of EMI test system with the first antenna assembly and the second antenna assembly according to the present invention is shown. The first antenna assembly 550 and the second antenna assembly 580 are disposed in the EMI chamber 200 of FIG. 5B. As shown in FIG. 5A, both the horizontal antenna and the vertical antenna are disposed at one location in the EMI chamber and the horizontal antenna is level with the vertical antenna and, so that time spending on regulating the horizontal antenna into vertical antenna can be saved. As shown in FIG. 5B, both horizontal antenna and vertical antenna with different heights are disposed in one location in the EMI chamber can further save the time from adjusting the height of the antenna. As shown in FIG. 2A and FIG. 5A, approximately half time can be saved by the design of the EMI test system as compared with the conventional testing design. As shown in FIG. 3, FIG. 4 and FIG. 5B, by comparison with the conventional testing method, the design of EMI test system only requires a quarter of time.

The EMI test system disclosed in the foregoing embodiments of the present invention can save time spending on the EMI chamber in the EMI test system. In the past, horizontal antenna needs to be regulated into vertical antenna first, and then time is spent on shifting the horizontal antenna to different heights for testing and following up with regulating the horizontal antenna into vertical antenna. However, in the present invention, both horizontal antenna and vertical antenna are both disposed in the EMI chamber for testing and four-assembly antenna are used so that cost and time required for testing the EUT are both saved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical magnetic interference (EMI) test system, disposed in a EMI chamber, for detecting an electromagnetic wave radiated from an equipment under test (EUT), the EMI test system comprising:
a testing table for supporting the EUT;
a horizontal antenna positioned at a first location of the EMI chamber for receiving the electromagnetic wave radiated from the EUT, and producing a horizontal electric wave;
a vertical antenna positioned at a second location of the EMI chamber for receiving the electromagnetic wave radiated from the EUT, and producing a vertical electric wave; and
a processing unit coupled to the horizontal antenna and the vertical antenna for transforming and analyzing the horizontal electric wave and the vertical electric wave, the processing unit including
a control unit disposed in the EMI test system for adjusting respective heights of the horizontal antenna and the vertical antenna,
a signal converting unit including an amplifier connected to the horizontal antenna and the vertical antenna respectively for amplifying the horizontal electric wave and the vertical electric wave, and further including a transformer connected to the amplifier for transforming the horizontal electric wave and the vertical electric wave into respectively a horizontal signal and a vertical signal, and
a data processing unit connected to the transformer for receiving and analyzing the horizontal signal and the vertical signal.

2. The system according to claim 1 wherein the control unit is further for adjusting a rotation angle of the testing table.

3. The system according to claim 2, wherein the testing table is a rotary station capable of 360-degree rotation.

4. The system according to claim 1, wherein the transformer is a spectrum analyzer.

5. The system according to claim 1, wherein the data processing unit is a computer.

6. The system according to claim 1, wherein a distance between the horizontal antenna and the EUT is substantially the same as a distance between the vertical antenna and the EUT.

7. The system according to claim 1, wherein:
the horizontal antenna includes a first horizontal antenna and a second horizontal antenna parallel to each other; and
the vertical antenna includes a first vertical antenna and a second vertical antenna parallel to each other;
wherein the first horizontal antenna and the first vertical antenna are positioned at a first height h1, and the second horizontal antenna and the second vertical antenna are positioned at a second height h2.

8. The system according to claim 1, wherein:
the horizontal antenna includes a first horizontal antenna and a second horizontal antenna and the vertical antenna includes a first vertical antenna and a second vertical antenna;
wherein the first horizontal antenna and the first vertical antenna are positioned at a first height h1, the second horizontal antenna and the second vertical antenna are positioned at a second height h2, and the second horizontal antenna and the second vertical antenna are parallel to the first vertical antenna and the first horizontal antenna respectively.

9. The system according to claim 1, wherein the EMI chamber is a space of 7×3×3 cubic meters.

10. The system according to claim 1, wherein the EMI chamber is a space of 7×4×3 cubic meters.

11. The system according to claim 1, wherein the EMI chamber is a space of 9×6×6 cubic meters.

12. A electrical magnetic interference (EMI) test system disposed in an EMI chamber, for detecting an electromagnetic wave radiated from an equipment under test (EUT), wherein the EMI test system comprises:
a testing table for supporting the EUT;
an antenna assembly disposed at a location of the EMI test system and comprising:

a horizontal antenna for receiving the electromagnetic wave radiated from the EUT and producing a horizontal electric wave; and a vertical antenna level with the horizontal antenna, for receiving the electromagnetic wave radiated from the EUT and producing a vertical electric wave; and a processing unit coupled to the horizontal antenna and the vertical antenna for transforming and analyzing the horizontal electric wave and the vertical electric wave, the processing unit including a control unit disposed in the EMI test system for adjusting respective heights of the horizontal antenna and the vertical antenna, a signal converting unit including an amplifier connected to the antenna assembly for amplifying the horizontal electric wave and the vertical electric wave, and further including a transformer connected to the amplifier for transforming the horizontal electric wave and the vertical electric wave into respectively a horizontal signal and a vertical signal, and a data processing unit connected to the transformer for receiving and analyzing the horizontal signal and the vertical signal.

13. The system according to claim 12, wherein the control unit is further for adjusting a rotation angle of the testing table.

14. The system according to claim 13, wherein the testing table is a rotary station capable of 360-degree rotation.

15. The system according to claim 12, wherein the transformer is a spectrum analyzer.

16. The system according to claim 12, wherein the data processing unit is a computer.

17. The system according to claim 12, wherein a distance between the first horizontal antenna and the EUT is substantially the same as a distance between the vertical antenna and the EUT.

18. The system according to claim 12, wherein the EMI test system further comprises another antenna assembly, positioned parallel to the antenna assembly and at a different height.

19. The system according to claim 12, wherein the EMI chamber is a space of 7×3×3 cubic meters.

20. The system according to claim 12, wherein the EMI chamber is a space of 7×4×3 cubic meters.

21. The system according to claim 12, wherein the EMI chamber is a space of 9×6×6 cubic meters.

* * * * *